(12) United States Patent
Sanfilippo et al.

(10) Patent No.: US 8,476,730 B2
(45) Date of Patent: Jul. 2, 2013

(54) GEIGER-MODE PHOTODIODE WITH INTEGRATED AND JFET-EFFECT-ADJUSTABLE QUENCHING RESISTOR, PHOTODIODE ARRAY, AND CORRESPONDING MANUFACTURING METHOD

(75) Inventors: Delfo Nunziato Sanfilippo, Catania (IT); Massimo Cataldo Mazzillo, Corato (IT); Piero Giorgio Fallica, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 455 days.

(21) Appl. No.: 12/764,888

(22) Filed: Apr. 21, 2010

(65) Prior Publication Data
US 2010/0271108 A1    Oct. 28, 2010

(30) Foreign Application Priority Data
Apr. 23, 2009    (IT) ............................... TO2009A0322

(51) Int. Cl.
*H01L 31/06* (2012.01)
(52) U.S. Cl.
USPC .... 257/465; 257/428; 257/461; 257/E31.053; 257/E31.079
(58) Field of Classification Search
USPC ................. 257/428, 430, 438, 461, 462, 465, 257/E31.053, E31.079
See application file for complete search history.

(56) References Cited

U.S. PATENT DOCUMENTS

| 4,313,127 A | * | 1/1982 | Su et al. ........................ 257/227 |
| 5,360,987 A | | 11/1994 | Shibib |

(Continued)

FOREIGN PATENT DOCUMENTS

| DE | 102007037020 | 8/2008 |
| EP | 1596439 | 11/2005 |

(Continued)

OTHER PUBLICATIONS

A. Campisia, L. Cosentino, P. Finocchiaro, A. Pappalardo, F. Musumeci, S. Privitera, A. Scordino, S. Tudisco, G. Fallica, D. Sanfilippo, M. Mazzillo, G. Condorelli, A. Piazza, G. Valvo, S. Lombardo, E Sciacca, G. Bonanno, M. Belluso, "Multipixel geiger-mode photon detectors for ultra-weak light sources", Nuclear Instruments and Methods in Physics Research A 571 (2007), pp. 350-354.

(Continued)

*Primary Examiner* — Matthew E Warren
(74) *Attorney, Agent, or Firm* — Graybeal Jackson LLP

(57) ABSTRACT

An embodiment of a Geiger-mode avalanche photodiode, having: a body made of semiconductor material of a first type of conductivity, provided with a first surface and a second surface and forming a cathode region; and an anode region of a second type of conductivity, extending inside the body on top of the cathode region and facing the first surface. The photodiode moreover has: a buried region of the second type of conductivity, extending inside the body and surrounding an internal region of the body, which extends underneath the anode region and includes the internal region and defines a vertical quenching resistor; a sinker region extending through the body starting from the first surface and in direct contact with the buried region; and a contact region made of conductive material, overlying the first surface and in direct contact with the sinker region.

25 Claims, 7 Drawing Sheets

U.S. PATENT DOCUMENTS

| | | | |
|---|---|---|---|
| 5,367,188 | A | 11/1994 | Kudo |
| 5,501,893 | A | 3/1996 | Laermer et al. |
| 6,118,142 | A | 9/2000 | Chen et al. |
| 6,541,836 | B2 * | 4/2003 | Iwanczyk et al. .............. 257/429 |
| 6,551,904 | B2 | 4/2003 | Kawahara |
| 6,693,337 | B2 | 2/2004 | Yoneda et al. |
| 6,949,445 | B2 | 9/2005 | Rhodes et al. |
| 6,995,444 | B2 | 2/2006 | Cova et al. |
| 2001/0017786 | A1 | 8/2001 | Woodward |
| 2002/0139970 | A1 | 10/2002 | Iwanczyk et al. |
| 2007/0045767 | A1 | 3/2007 | Zhu et al. |
| 2008/0121988 | A1 | 5/2008 | Mallikararjunaswamy et al. |
| 2008/0157150 | A1 | 7/2008 | Shim |
| 2008/0191238 | A1 | 8/2008 | Madathil et al. |
| 2008/0308738 | A1 | 12/2008 | Li et al. |
| 2008/0315248 | A1 | 12/2008 | Tokura et al. |
| 2009/0032896 | A1 | 2/2009 | Taniguchi et al. |
| 2009/0057757 | A1 | 3/2009 | Hokomoto et al. |
| 2009/0065826 | A1 | 3/2009 | Hwang |
| 2009/0184317 | A1 | 7/2009 | Sanfilippo et al. |
| 2009/0184384 | A1 | 7/2009 | Sanfilippo et al. |
| 2010/0127314 | A1 | 5/2010 | Frach |
| 2010/0148040 | A1 | 6/2010 | Sanfilippo et al. |
| 2010/0271108 | A1 | 10/2010 | Sanfilippo et al. |
| 2011/0095388 | A1 | 4/2011 | Richter et al. |

FOREIGN PATENT DOCUMENTS

| | | |
|---|---|---|
| EP | 1744366 | 1/2007 |
| EP | 1755171 | 2/2007 |
| IT | TO20080045 | 4/2008 |
| IT | TO20080046 | 4/2008 |
| RU | 2102821 | 1/1998 |
| WO | 2007108456 A1 | 9/2007 |
| WO | 2008129433 | 10/2008 |

OTHER PUBLICATIONS

Massimo Mazzillo, Alessandro Piazza, Giovanni Condorelli, Delfo Sanfilippo, Giorgio Fallica, Sergio Billotta, Massimiliano Belluso, Giovanni Bonanno, Luigi Cosentino, Alfio Pappalardo, and Paolo Finocchiaro, "Quantum Detection Efficiency in Geiger Mode Avalanche Photodiodes", IEEE Transactions on Nuclear Science, vol. 55, No. 6, December 2008, pp. 3620-3625.

F. Zappa, S. Tisa , A. Tosi, S. Cova, "Principles and features of single-photon avalanche diode arrays", Sensors and Actuators A 140 (2007), pp. 103-112.

M. Mazzillo, G. Condorelli, A. Campisi, E. Sciacca, M. Belluso, S. Billotta, D. Sanfilippo, G. Fallica, L. Cosentino, P. Finocchiaro, F. Musumeci, S. Privitera, S. Tudisco, S. Lombardo, E. Rimini, G. Bonanno, "Single photon avalanche photodiodes arrays", Sensors and Actuators A 138 (2007), pp. 306-312.

E. Sciacca, S. Lombardo, M. Mazzillo, G. Condorelli, D. Sanfilippo, A. Contissa, M. Belluso, F. Torrisi, S. Billotta, A. Campisi, L. Cosentino, A. Piazza, G. Fallica, P. Finocchiaro, F. Musumeci, S. Privitera, S. Tudisco, G. Bonanno, and E. Rimini, "Arrays of Geiger Mode Avalanche Photodiodes", IEEE Photonics Technology Letters, vol. 18, No. 15, Aug. 1, 2006, pp. 1633-1635.

Brian F. Aull, Andrew H. Loomis, Douglas J. Young, Richard M. Heinrichs, Bradley J. Felton, Peter J. Daniels, and Deborah J. Landers, "Geiger-Mode Avalanche Photodiodes for Three-Dimensional Imaging", Lincoln Laboratory Journal, vol. 13, No. 2, 2002, pp. 335-350.

Cristiano Niclass, Alexis Rochas, Pierre-André Besse, and Edoardo Charbon, "Design and Characterization of a CMOS 3-D Image Sensor Based on Single Photon Avalanche Diodes", IEEE Journal of Solid-State Circuits, vol. 40, No. 9, Sep. 2005, pp. 1847-1854.

Massimo Mazzillo, Alessandro Piazza, Giovanni Condorelli, Delfo Sanfilippo, Giorgio Fallica, Sergio Billotta, Massimiliano Belluso, Giovanni Bonanno, Luigi Cosentino, Alfio Pappalardo, and Paolo Finocchiaro, "Quantum Detection Efficiency in Geiger Mode Avalanche Photodiodes", IEEE Transactions on Nuclear Science, vol. 55, No. 6, Dec. 2008, pp. 3620-3625.

Emilio Sciacca, Andrea C. Giudice, Delfo Sanfilippo, Franco Zappa, Salvatore Lombardo, Rosario Consentino, Cinzia Di Franco, Massimo Ghioni, Giorgio Fallica, Giovanni Bonanno, Sergio Cova, and Emanuele Rimini, "Silicon Planar Technology for Single-Photon Optical Detectors", IEEE Transactions on Electron Devices, vol. 50, No. 4, Apr. 2003, pp. 918-925.

K. Shimakura, T. Suzuki and Y. Yadoiwa, "Boron and Phosphorus Diffusion Through an $SiO_2$, Layer From a Doped Polycrystalline Si Source Under Various Drive-In Ambients", Solid-State Electronics, 1975, vol. 18, pp. 991-997.

Search Report for Italian Application No. TO20100251, Ministero dello Sviluppo Economico, Nov. 12, 2010, pp. 3.

Search Report based on Italian Patent Application Serial No. TO20080945, Ministero dello Sviluppo Economico, Munich, Nov. 4, 2009, pp. 2.

S. Cova, M. Ghioni, A. Lacaita, C. Samori, and F. Zappa, "Avalanche photodiodes and quenching circuits for single-photon detection", Applied Optics, vol. 35, No. 12, Apr. 20, 1996, pp. 1956-1976.

B. Dolgosheina, V. Balagurab, P. Buzhana, M. Danilovb, L. Filatovd, E. Garuttic, M. Grolle, A. Ilyina, V. Kantserova, V. Kaplina, A. Karakasha, F. Kayumova, S. Klemind, V. Korbelc, H. Meyerc, R. Mizukb, V. Morgunovb, E. Novikovb, P. Pakhlovb, E. Popovaa, V. Rusinovb, F. Sefkowc, E. Tarkovskyb, I. Tikhomirovb, Calice/SiPM Collaboration, "Status report on silicon photomultiplier development and its applications", Nuclear Instruments and Methods in Physics Research A 563 (2006), pp. 368-376.

Claudio Piemonte, "A new Silicon Photomultiplier structure for blue light detection", Nuclear Instruments and Methods in Physics Research A 568 (2006), pp. 224-232.

Z. Sadygova, A. Olshevskia, I. Chirikova, I. Zheleznykhc, A. Novikov, "Three advanced designs of micro-pixel avalanche photodiodes: Their present status, maximum possibilities and limitations", Nuclear Instruments and Methods in Physics Research A 567 (2006), pp. 70-73.

W.J. Kindt, N.H. Shahrjerdy, H.W. van Zeijl, "A silicon avalanche photodiode for single optical photon counting in the Geiger mode", Sensor and Actuators A 60 (1997), pp. 98-102.

D. Renker, "Geinger-mode avalanche photodiodes, history, properties and problems", Nuclear Instruments and Methods in Physics Research A 567 (2006), pp. 48-56.

P. Buzhana, B. Dolgosheina, L. Filatovb, A. Ilyina, V. Kantzerova, V. Kaplina, A. Karakasha, F. Kayumovc, S. Kleminb, E. Popovaa, S. Smirnov, "Silicon photomultiplier and its possible applications", Nuclear Instruments and Methods in Physics Research A 504 (2003) 48-52.

Massimo Ghioni, Angelo Gulinatti, Ivan Rech, Franco Zappa, and Sergio Cova, "Progress in Silicon Single-Photon Avalanche Diodes", IEEE Journal of Selected Topics in Quantum Electronics, vol. 13, No. 4, Jul./Aug. 2007, pp. 852-862.

J. C. Jackson, D. Phelan, A. P. Morrison, R. M. Redfern and A. Mathewson, "Towards integrated single photon counting microarrays", Optical Engineering, vol. 42, No. 1, Jan. 2003, pp. 112-118.

Franco Zappa, Angelo Gulinatti, Piera Maccagnani, Simone Tisa, and Sergio Cova, "SPADA: Single-Photon Avalanche Diode Arrays", IEEE Photonics Technology Letters, vol. 17, No. 3, Mar. 2005, pp. 657-659.

Dieter Renker, "Properties of avalanche photodiodes for applications in high energy physics, astrophysics and medical imaging", Nuclear Instruments and Methods in Physics Research A 486 (2002), pp. 164-169.

S. Vasile, P. Gothoskar, R. Farrell and D. Sdrulla, "Photon Detection with High Avalanche Photodiode Arrays", IEEE Transactions on Nuclear Science, vol. 45, No. 3, Jun. 1998, pp. 720-723.

U.S. Appl. No. 13/070,876, filed Mar. 24, 2011, "Geiger-Mode Avalanche Photodiode With High Signal-To-Noise Ratio, and Corresponding Manufacturing Process".

Italian Search Report for Application No. ITTO20090322, Ministero dello Sviluppo Economico, Nov. 6, 2009.

* cited by examiner

GEIGER-MODE PHOTODIODE WITH INTEGRATED AND JFET-EFFECT-ADJUSTABLE QUENCHING RESISTOR, PHOTODIODE ARRAY, AND CORRESPONDING MANUFACTURING METHOD

RELATED APPLICATION DATA

This application is related to U.S. patent application Ser. No. 12/356,445, entitled ARRAY OF MUTUALLY ISOLATED, GEIGER-MODE, AVALANCHE PHOTODIODES AND MANUFACTURING METHOD THEREOF filed Jan. 20, 2009; U.S. patent application Ser. No. 12/356,464, entitled ARRAY OF MUTUALLY INSULATED GEIGER-MODE AVALANCHE PHOTODIODES, AND CORRESPONDING MANUFACTURING PROCESS filed Jan. 20, 2009; U.S. patent application Ser. No. 12/637,628, entitled GEIGER-MODE PHOTODIODE WITH INTEGRATED AND ADJUSTABLE QUENCHING RESISTOR, PHOTODIODE ARRAY, AND MANUFACTURING METHOD THEREOF filed Dec. 14, 2009; and U.S. patent application Ser. No. 13/070,876, entitled GEIGER-MODE AVALANCHE PHOTODIODE WITH HIGH SIGNAL-TO-NOISE RATIO, AND CORRESPONDING MANUFACTURING PROCESS filed Mar. 24, 2011.

PRIORITY CLAIM

The instant application claims priority to Italian Patent Application No. TO2009A000322, filed Apr. 23, 2009, which application is incorporated herein by reference in its entirety.

TECHNICAL FIELD

An embodiment of the present disclosure relates to a Geiger-mode photodiode with integrated and JFET-effect-adjustable quenching resistor, to a photodiode array, and to a corresponding manufacturing method.

BACKGROUND

In the technical field of photon detection, there is a need for devices that will enable high-sensitivity detection of electromagnetic radiation, and hence enable detection of an even limited number of photons associated with the electromagnetic radiation itself.

For the above purpose, the so-called Geiger-mode avalanche photodiodes (GM-APD) are known, which theoretically enable detection of single photons.

A Geiger-mode avalanche photodiode, also known as single-photon avalanche diode (SPAD), is formed by an avalanche photodiode (APD), and hence comprises a junction, typically of the P-I-N type, and an additional region of semiconductor material slightly doped, alternatively, P or N; the additional region is set between the intrinsic region I and the region of the P-I-N junction having a conductivity of an opposite type with respect to the conductivity of the additional region itself so as to provide a structure formed by regions made of semiconductor material that present a succession according to a P-N-I-N or else N-P-I-P scheme.

On the basis of the physical phenomena that arise, the additional region is also known as multiplication region in so far as it is the site of phenomena of impact ionization, whilst the intrinsic region is also known as absorption region, since the majority of the photons are absorbed therein.

In greater detail, the junction has a breakdown voltage $V_B$ and is biased, in use, with a reverse-biasing voltage $V_A$ higher in magnitude than the breakdown voltage $V_B$ of the junction, typically higher by 10-20%. In this way, the generation of a single electron-hole pair, following upon absorption of a photon impinging on the SPAD, is sufficient for triggering an ionization process that causes an avalanche multiplication of the carriers, with gains of around $10^6$ and consequent generation in short times (hundreds of picoseconds) of the avalanche current. This avalanche current may be appropriately collected, typically by means of a external circuitry coupled to the junction, for example, by means of anode and cathode contacts, and represents an output signal of the SPAD.

To be precise, across the junction an effective voltage $V_e$ is present, which may coincide with the reverse-biasing voltage $V_A$ only in the absence of photons. In fact, in the presence of photons, and hence of current generated inside the SPAD, the effective voltage $V_e$ across the junction may be lower, in magnitude, than the reverse-biasing voltage $V_A$. However, in the present document it is assumed, except where otherwise expressed explicitly, that the effective voltage $V_e$ across the junction coincides or approximately coincides with the reverse-biasing voltage $V_A$.

The gain and likelihood of detection of a photon, i.e., the sensitivity of the SPAD, are directly proportional to the value of reverse-biasing voltage $V_A$ applied to the SPAD. In fact, the more the reverse-biasing voltage $V_A$ exceeds, in magnitude, the breakdown voltage $V_B$, the higher the likelihood of an avalanche generation of charge carriers to occur.

However, high reverse-biasing voltages $V_A$ allow, even in the absence of incident photons (dark conditions), a single charge carrier, generated for example by transfer of thermal energy, to be sufficient to trigger the avalanche-ionization process, generating so-called dark current, which may adversely interfere with the normal use of the SPAD.

In addition, the fact that the reverse-biasing voltage $V_A$ is appreciably higher than the breakdown voltage $V_B$ may cause the avalanche-ionization process, once triggered, to be self-sustaining. Consequently, once triggered, the SPAD is no longer able to detect photons, with the consequence that, in the absence of appropriate remedies, the SPADs described may manage to detect arrival of a first photon, but not arrival of subsequent photons.

To be able to detect also these subsequent photons, one may quench the avalanche current generated inside the SPAD, stopping the avalanche-ionization process. In detail, one may lower, for a period of time known as a "hold-off time", the effective voltage $V_e$ across the junction, so as to inhibit the ionization process and quench the avalanche current, as described hereinafter. Next, the initial conditions of biasing of the junction are restored so that the SPAD will be again able to detect photons. Since during the hold-off time the SPAD is not able to detect photons, it is desirable for it to be as short as possible.

To lower the effective voltage $V_e$ across the junction following upon absorption of a photon, SPADs may have a so-called quenching circuit.

Amongst other things, there are known quenching circuits of a passive type, comprising a quenching resistor set in series with the junction and having a resistance on the order of hundreds of kilo-ohms.

In the absence of photons, the presence of the quenching resistor does not alter the effective voltage $V_e$ across the junction, which may be equal to the reverse-biasing voltage $V_A$. However, following absorption of a photon and a consequent triggering of the ionization process, the avalanche current that originates therefrom causes, by flowing in the quenching resistor, a reduction of an exponential type of the effective voltage $V_e$ across the junction, which voltage decreases until it reaches a value that may be just a little higher than the breakdown voltage $V_B$. As regards, instead, the avalanche current, immediately after triggering of the avalanche-ionization process (turning-on of the SPAD), it passes from a zero value to a peak value, then decreases exponentially towards an asymptotic value, which is inversely proportional to the resistance of the quenching resistor and directly proportional to the difference between the reverse-biasing voltage $V_A$ and the breakdown voltage $V_B$, this difference being generally known as overvoltage (OV).

In detail, it may be shown that the avalanche-ionization process is arrested in the case where the value of the avalanche current drops below a threshold value known as latching current I. Consequently, given a quenching resistor having a resistance $R_q$, it is able to quench the avalanche current in the event of overvoltage equal at the most to the product $R_q \cdot I$, i.e., in the event of reverse biasing voltages $V_A$ not higher than $V_B + R_q \cdot I$. If these conditions are respected, the avalanche current is typically quenched; next, the SPAD, the behavior of which is to a certain extent comparable to that of a capacitor, recharges exponentially through the quenching resistor, in such a way that the effective voltage $V_e$ across the junction returns to being equal to the reverse-biasing voltage $V_A$, the SPAD thus being ready to detect the arrival of a new photon. During the recharging time, i.e., in the time interval in which the effective voltage $V_e$ increases exponentially until it returns to being equal or approximately equal to the reverse-biasing voltage $V_A$, the SPAD has a reduced sensitivity, which increases as the effective voltage $V_e$ increases.

On the basis of what has been said, it may be inferred that applications that are particularly demanding in terms of sensitivity typically require high overvoltages OV, hence high reverse-biasing voltages $V_A$, with the consequence that the quenching resistor must assume high values; otherwise, it would be difficult to impossible to quench the avalanche current and thus detect subsequent photons.

Quenching resistors with high resistances entail a recharge time that is longer than what may be obtained in the presence of lower resistances; however, they entail an additional advantage. In fact, during the recharge time the SPAD is certainly less sensitive to arrival of the photons, but is also less sensitive to the afterpulsing phenomenon, which usually degrades the performance of the SPADs. In detail, the afterpulsing phenomenon consists of the secondary emission of carriers owing to the presence of lattice defects in the depletion region, which create intermediate energy levels (comprised between the conduction band and the valence band) that can capture one or more carriers of the avalanche current, then releasing them with unpredictable delays, causing an increase in the dark current and distorting the output signal of the SPAD.

Typically, the value of resistance of the quenching resistor is sized as a function of the required recharging times and sensitivity to the afterpulsing phenomenon, as well as the type of application envisaged for the SPAD.

Similar considerations may be made as regards the so-called SPAD arrays, and moreover as regards the so-called silicon photomultipliers (SiPMs), used in order to improve the performance that can be obtained with individual SPADs.

In particular, an SPAD photodiode array, two examples of which are shown in the U.S. Publication No. 2009/0184384 and U.S. Publication No. 2009/0184317 and which are incorporated by reference, is formed by a planar array of SPADs grown on one and the same substrate.

An SiPM is a particular SPAD array. In detail, the SiPM is formed by an SPAD array grown on one and the same substrate and provided with respective quenching resistors (for example, of a vertical type) integrated in the SPADs, these quenching resistors being uncoupled from and independent of one another. In addition, the anode and cathode contacts of each SPAD are configured so that they can be coupled to a single voltage generator. Consequently, the SPADs of the SiPM can be biased at one and the same reverse-biasing voltage $V_A$. In addition, the avalanche currents generated therein are multiplied together so as to generate an output signal of the SiPM equal to the summation of the output signals of the SPADs. As regards the terminology, in the technical field of SiPMs it is common to refer to the ensemble formed by the photodiode and the quenching resistor as pixel, the SiPM being hence formed by an array of pixels.

The SiPM is hence a device with a large area and high gain, capable of supplying, on average, an electrical output signal (current) proportional to the number of photons that impinge on the SiPM. In fact, since the quenching resistors are uncoupled from one another, each photodiode of the SiPM behaves as an independent binary counter, whilst the output signal of the SiPM is proportional to the number of pixels activated, i.e., to the number of SPADs where the avalanche-ionization process (detection of a photon) is triggered, this number being in turn proportional to the number of incident photons.

In order to obtain an SPAD and an SiPM with flexibility of use, U.S. patent application Ser. No. 12/637,628, which is incorporated by reference, describes an SPAD, which has a body made of semiconductor material with a first type of conductivity, and forms a first surface and a second surface. In addition, the SPAD has a trench that extends through the body starting from the first surface and surrounds an active region. Present within the trench is a lateral insulation region, which comprises a conductive region of metal material and an insulation region, the latter being made of dielectric material and surrounding the conductive region. Extending within the active region, starting from the first surface, is an anode region of a second type of conductivity. In addition, the active region forms a cathode region, which extends between the anode region and the second surface and defines a vertical quenching resistor. The SPAD further comprises a contact region made of conductive material overlying the first surface and in direct contact with the conductive region present inside the trench.

By electrically connecting the contact region to an external biasing circuit, it is possible to bias the contact region itself to a gate voltage $V_G$. In this way, a depletion region is created around the insulation region and internally around the active region. Consequently, by varying the gate voltage $V_G$, it is possible to modulate the extent of the depletion region, consequently varying the resistance of the quenching resistor. In this way, it is possible to adapt each time the SPAD, and in particular the resistance of the quenching resistor, to the requirements of the application envisaged for the SPAD.

Even though the SPAD described represents a considerable improvement in terms of adaptability of the photodiode to the type of application, it envisages the use of at least one epitaxial layer with a low level of doping (in the limit, intrinsic) and large thickness (of the order of 50-60 µm), in order to provide values of resistance of the quenching resistor that are sufficiently high. Consequently, the trench may have a large depth, and hence a high aspect ratio, i.e., a high depth/width ratio; in fact, the width of the trench may be on the order of microns and typically cannot be increased; otherwise, the overall geometrical dimensions may increase. Also, the provision of trenches with high aspect ratios may require nonstandard technological processes, such as, for example, repetition of cycles of passivation and etching carried out in an environment rich in fluorine, as well as the use of non-conventional machinery, with a consequently higher complexity of production. In addition, filling of these trenches with metal material in order to provide the conductive region of metal material may be technologically complex.

SUMMARY

An embodiment of the present disclosure provides a Geiger-mode avalanche photodiode and a manufacturing process that enables at least a partial solution of the drawbacks of the known art.

BRIEF DESCRIPTION OF THE DRAWINGS

For a better understanding of the disclosure, one or more embodiments of the disclosure are now described, purely by way of non-limiting example and with reference to the attached drawings, wherein.

DETAILED DESCRIPTION

Figure 1:
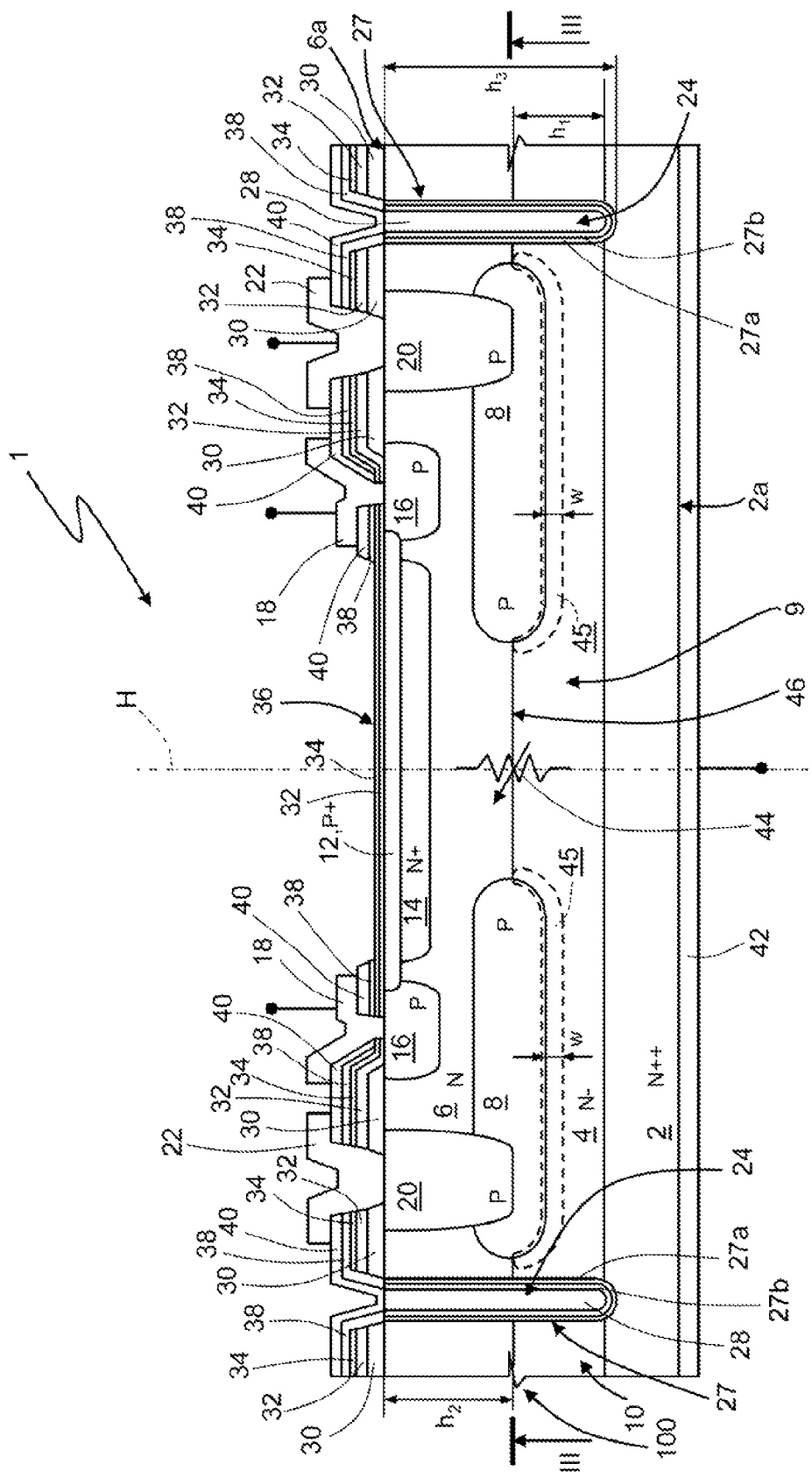
FIG. 1 shows a cross section of an embodiment of an avalanche photodiode.
Figure 2:
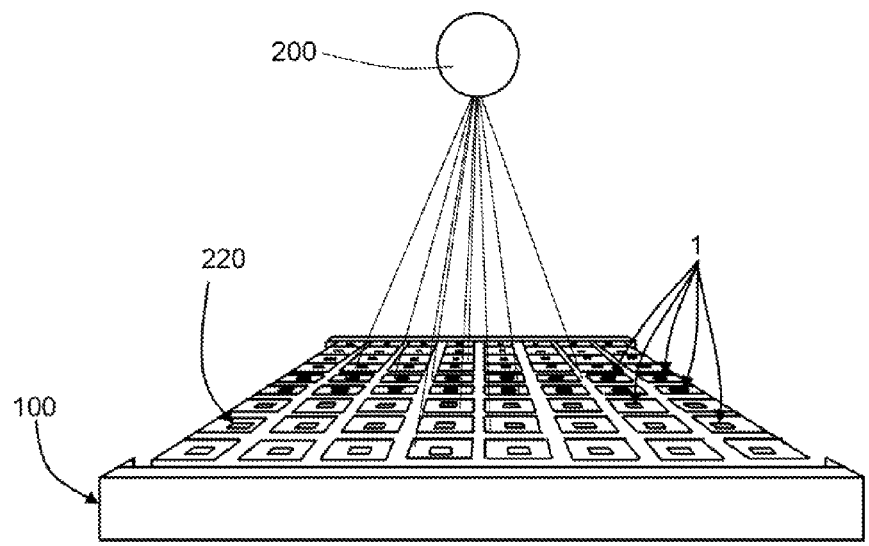
FIG. 2 is a schematic illustration of an embodiment of a photodiode array during use.

FIG. 1 shows an example of embodiment of a Geiger-mode avalanche photodiode 1. The photodiode 1 may belong, for example, to an array 220 of photodiodes 1, as illustrated in FIG. 2, which also shows an external light source 200. The array 220 may comprise any number of photodiodes 1 according to the application.

Returning to FIG. 1, the photodiode 1 is integrated in a chip 100 that includes a substrate 2, which is made of semiconductor material of an N++ type and has a bottom surface 2a. In addition, the photodiode 1 includes: a first epitaxial layer 4 of an N− type, which has a thickness $h_1$ of, for example, approximately 10 µm, and overlies, in direct contact therewith, the substrate 2; and a second epitaxial layer 6, of an N type, which has a top surface 6a and a thickness $h_2$ of, for example, approximately 5 µm, and overlies the first epitaxial layer 4.

Extending between the first and second epitaxial layers 4 and 6 is a buried region 8, of a P type and with the shape, in top plan view, of an annulus. The buried region 8 defines an internal region 9 formed by the semiconductor material set internally with respect to the buried region 8. The internal region 9 has a circular shape, in top plan view, with a diameter D and an area $A_t$, which will be referred to in what follows as transverse area $A_t$.

The substrate 2, the first epitaxial layer 4, and the second epitaxial layer 6 form in practice a body 10, which is made of semiconductor material and has an axis H perpendicular to the first surface 2a and to the second surface 6a; extending inside the body 10 is the buried region 8. In addition, the level of doping of the substrate 2 is higher by approximately at least three orders of magnitude, for example by approximately five, than the level of doping of the first epitaxial layer 4; the difference between the levels of doping of the first and second epitaxial layers 4 and 6 is instead, for example, approximately two orders of magnitude.

An anode region 12, of a P+ type and of a circular or polygonal shape (for example, quadrangular), faces the top surface 6a and extends inside the second epitaxial layer 6 so as to overly the internal region 9 defined by the buried region 8. In detail, the anode region 12, the buried region 8, and, hence, the internal region 9 are substantially aligned with respect to the axis H.

An enriched region 14, of an N+ type, extends in the second epitaxial layer 6, underneath and in direct contact with the anode region 12, and in turn overlies the internal region 9. In top plan view, the enriched region 14 has a circular or polygonal shape (for example, quadrangular) with an area $A_a$, which in what follows is referred to as active area $A_a$.

For practical purposes, the anode region 12 and the enriched region 14 form a first PN junction, designed to receive photons and to generate the avalanche current, as described in detail hereinafter. The enriched region 14 and the second epitaxial layer 6 have, instead, the purpose of confining a high electric field in the proximity of the first PN junction, thus reducing the breakdown voltage $V_B$ of the junction itself.

A guard ring 16 of a circular shape, and of a P type, extends in the second epitaxial layer 6, facing the top surface 6a, externally and contiguous to the anode region 12. The guard ring 16 forms a PN diode with the second epitaxial layer 6 so as to prevent edge breakdown of the anode region 12. In addition, the guard ring 16 is in direct electrical contact with an anode metallization 18, by means of which it is possible to bias the first PN junction; in particular, it is possible to apply to the anode metallization 18 a reverse-biasing voltage $V_A$ that is higher, in magnitude, than the breakdown voltage $V_B$ of the first PN junction.

The types of the anode region 12 and of the guard ring 16, and hence the corresponding levels of doping, are such that the depletion region that is present bestriding the interface between regions of a P type (anode region 12 and guard ring 16) and regions of an N type (enriched region 14 and second epitaxial layer 6) extends principally in the guard ring 16, rather than in the anode region 12, preventing a high field electric from localizing at the interface between the anode region 12 (semiconductor) and the layers of oxide present on the anode region 12 (described hereinafter), thus reducing the dark current of the photodiode 1. In fact, this interface is rich in Shockley-Read-Hall (SRH) centers, and hence it is expedient to limit the electric fields in its proximity; otherwise, there may be an undesirable increase of the dark current of the photodiode 1.

Externally with respect to the guard ring 16, a deep region ("sinker") 20, of a P type and of a circular or polygonal shape, in top plan view, extends vertically starting from the top surface 6a, until it comes into direct contact with the buried region 8. In addition, the sinker region 20 is in direct electrical contact with a sinker metallization 22, which may be set in contact with an external junction-biasing circuit (not shown), configured for supplying a junction biasing voltage $V_J$, as described in detail hereinafter.

The photodiode 1 further comprises a lateral insulation region 24, set externally with respect to the sinker region 20. In detail, the lateral insulation region 24 has a circular or polygonal shape, in top plan view, and extends vertically with a depth $h_3$, for example greater than or equal to $h_1+h_2$.

The lateral insulation region 24 comprises a channel-stopper region 27 set further out, made of dielectric material, for example oxide, and in direct contact with the substrate 2, the first epitaxial layer 4, and the second epitaxial layer 6. In addition, the lateral insulation region comprises a metal region 28, made, for example, of tungsten, which fills and is surrounded by the channel-stopper region 27, and is moreover in direct contact with a dielectric layer described in detail hereinafter and referred to as fourth dielectric layer 40.

The channel-stopper region 27 is formed by a double layer: a thin coating layer 27a, made, for example, of thermal oxide, set further out, and a thick coating layer 27b, made, for example, of TEOS oxide, set further in. The thickness of the thin coating layer 27a may be in the range of approximately 15-25 nm, whilst the thickness of the thick coating layer 27b may be in the range of approximately a few hundreds of nanometers (for example, approximately 100-200 nm).

Present on a peripheral region of the top surface 6a, laterally staggered with respect to the anode region 14, is a first dielectric layer 30. The first dielectric layer 30 extends partially also on the guard ring 16 and the sinker region 20, except, respectively, for the anode metallization 18 and the sinker metallization 22.

A second dielectric layer 32, made, for example, of TEOS oxide, extends over the top surface 6a, on the first dielectric layer 30, over the anode region 12, and the guard ring 16, except for the contact with the anode metallization 18. A coating layer 34, made, for example, of nitride, extends on the second dielectric layer 32 and provides, together with this, a double-layer anti-reflection coating (DLARC) 36.

By appropriately modulating, in a known way, the thickness of the second dielectric layer 32 and of the coating layer 34, it is possible to tune the anti-reflection coating 36 in such a way that it will be transparent only for a specific interval of wavelengths, and will reflect the wavelengths outside of this interval. It is thus possible to provide photodiodes 1 that are sensitive only to some wavelengths of the light spectrum.

A third dielectric layer 38 (made, for example, of TEOS oxide), which forms a single layer with the thick coating layer 27b, and the aforesaid fourth dielectric layer 40 (made, for example, of TEOS oxide) extend over the coating layer 34, laterally staggered with respect to the anode region 12. However, as mentioned previously, on top of the sinker region 20 the sinker metallization 22 is present, which traverses the dielectric layers 32, 38, 40 and the coating layer 34 and is in direct contact with the sinker region 20. Likewise, present on the metal region 28 of the lateral insulation region 24 is the fourth dielectric layer 40, which is in direct contact with the metal region 28 itself.

A cathode metallization 42 made of metal material extends underneath the bottom surface 2a of the substrate 2. In this way, given the arrangement of the anode metallization 18, the avalanche current flows in the direction of the axis H.

For practical purposes, the enriched region 14, the second epitaxial layer 6, the first epitaxial layer 4, and the substrate 2 form a cathode region. In addition, inside the substrate 2, the potential drop due to the passage of the avalanche current may be considered to be negligible, on account of the low resistivity of the substrate 2. Consequently, inside the cathode region, the first epitaxial layer 4 and the second epitaxial layer 6 form an integrated, vertical, quenching resistor 44 electrically coupled between the anode region 12 and the substrate 2, and capable of quenching the avalanche current generated following upon absorption of a photon.

The resistance of the quenching resistor 44 is determined, as well as by the thicknesses $h_1$ and $h_2$ and by the levels of doping of the first epitaxial layer and of the second epitaxial layer, by the shape of the buried region 8, and in particular by the transverse area $A_t$ of the internal region 9. In fact, the buried region 8 and the first epitaxial layer 4 form a second PN junction. Consequently, also without applying to the sinker metallization 22 any junction biasing voltage $V_J$, a depletion region 45 is present, which extends not only inside the buried region 8, but also inside the first epitaxial layer 4. In particular, in addition to extending in the buried region 8 with a negligible thickness, the depletion region 45 extends in the first epitaxial layer 4 with a thickness w, measured starting from the buried region 8 and which will be referred to hereinafter as depletion thickness w.

Figure 3:
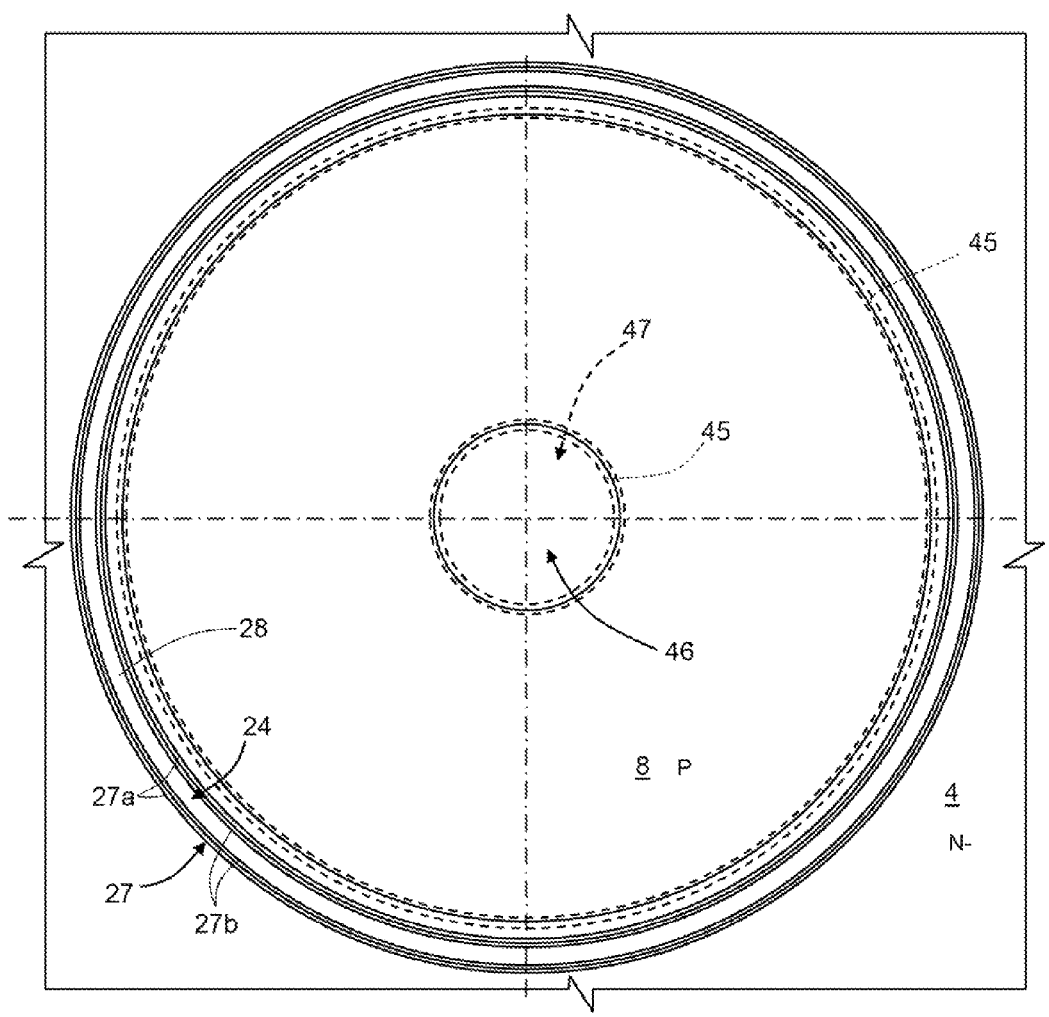
FIG. 3 shows a top plan view of a cross section of the photodiode shown in FIG. 1.

Given the absence of free charges, the avalanche current cannot flow inside the depletion region 45. Consequently, defining a section 46 of the internal region 9 perpendicular to the axis H, with area equal to the transverse area $A_t$, and set at the interface between the first and second epitaxial layers 4, 6, the avalanche current is forced to flow through a flow portion 47 (FIG. 3) of this section 46. In detail, the flow portion 47 has an area, which in what follows will be referred to as effective area $A_e$, equal to the difference between the transverse area $A_t$ of the section 46 and the area of a portion of the section 46 occupied by the depletion region 45. The resistance of the quenching resistor 44 also depends upon this effective area $A_e$.

The buried region 8 also forms with the second epitaxial layer 6 a third PN junction, with consequent creation of a further depletion region (not shown); however, on account of the higher level of doping of the second epitaxial layer 6 with respect to the first epitaxial layer 4, this further depletion region extends inside the second epitaxial layer 6 with a negligible thickness with respect to the depletion thickness w; hence to a first approximation it does not have any effect on the resistance of the quenching resistor 44.

In the case where the value of resistance of the quenching resistor 44 is not sufficient in relation to the type of use and of biasing envisaged for the photodiode 1, it is possible to increase the resistance by decreasing the value of the effective area $A_e$.

For this purpose, the sinker metallization 22 can be set in contact with the external junction-biasing circuit so as to reverse-bias the second PN junction, formed by the buried region 8 and by the first epitaxial layer 4. In particular, the more the second PN junction is reverse-biased, the more the depletion thickness w increases. Consequently, by applying to the sinker metallization 22 a negative junction biasing voltage $V_J$, the depletion thickness w increases proportionally to the magnitude of the junction biasing voltage $V_J$, with consequent reduction in the effective area $A_e$ and increase in the resistance of the quenching resistor 44. In this way, it becomes possible to apply to the photodiode 1 higher overvoltages OV, hence higher reverse-biasing voltages $V_A$, thus improving the sensitivity and the quantum efficiency of the photodiode 1.

From a practical standpoint, the buried region 8 enables variation of the resistance of the quenching resistor 44 on the basis of an effect similar to the one used in JFETs.

As regards, instead, the lateral insulation region 24, it enables, by means of the metal region 28, optical insulation of the photodiodes 1 of the array 220. In addition, the oxide present in the channel stopper 27 provides electrical insulation between the photodiodes 1 of the array 220, rendering the quenching resistors 44 independent of one another. In other words, the lateral insulation region 24 enables limitation of the adverse effects on the photodiode 1 induced by charge carriers (for example, electrons) generated by adjacent photodiodes, and by photons generated by electroluminescence during the process of avalanche multiplication in adjacent photodiodes, these effects being known respectively as "electrical crosstalk" and "optical crosstalk".

Since the lateral insulation region 24 extends as far as the substrate 2, and given the low resistivity of the substrate 2, each pixel of the array 220 is electrically and optically uncoupled from the other pixels. In fact, since the avalanche current produces a potential drop in the substrate 2 of a negligible amount, turning-on of a photodiode 1 does not alter biasing of the adjacent photodiodes 1. Consequently, the array 220 of photodiodes 1 provides a SiPM semiconductor photomultiplier, in which all the photodiodes 1 work in approximately the same operating conditions.

Figure 4:
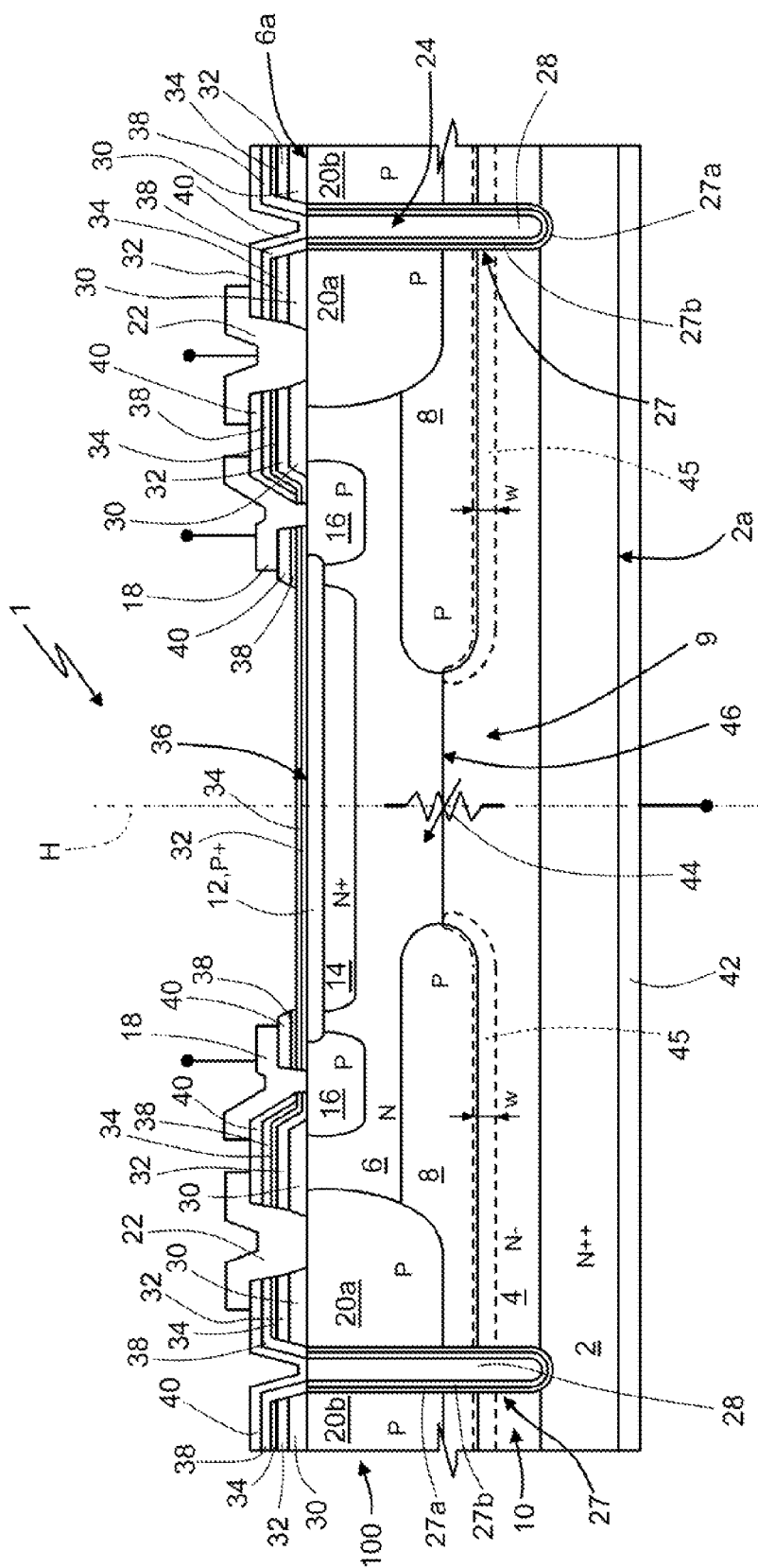
FIG. 4 shows a cross section of a further embodiment of an avalanche photodiode.
Figure 5:
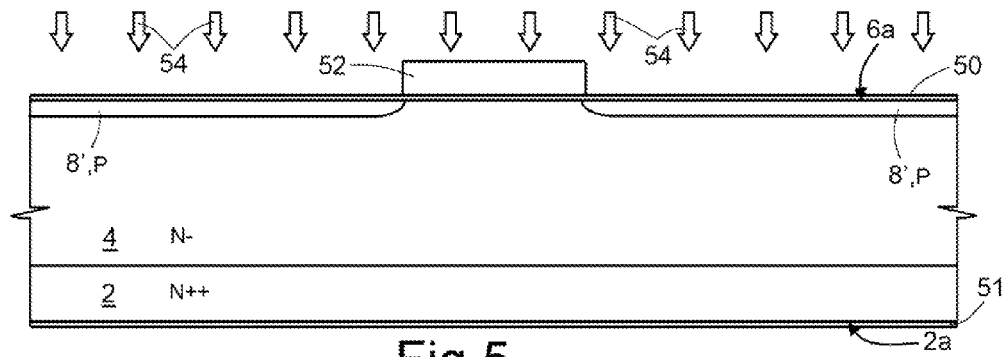
FIGS. 5-14 show cross sections of an embodiment of an avalanche photodiode during successive manufacturing steps.
Figure 6:
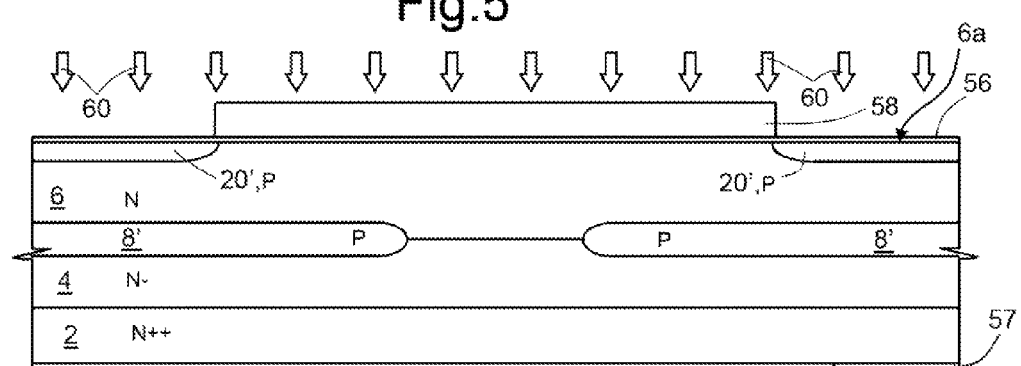
Figure 7:
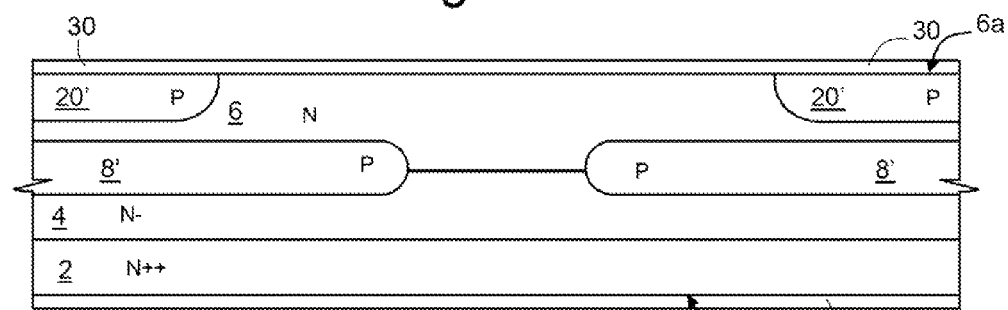
Figure 8:
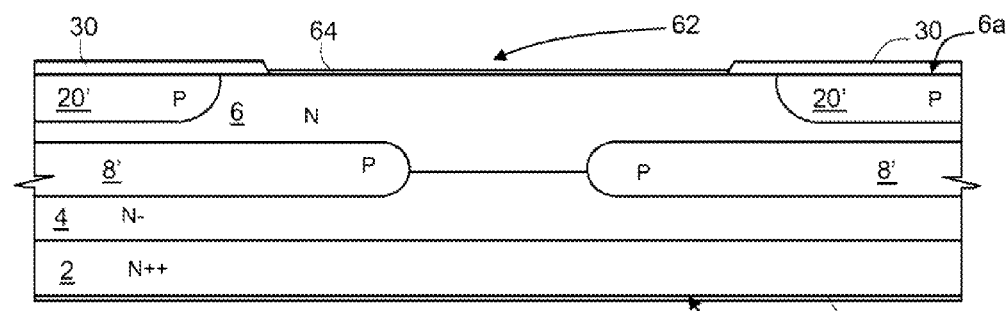
Figure 9:
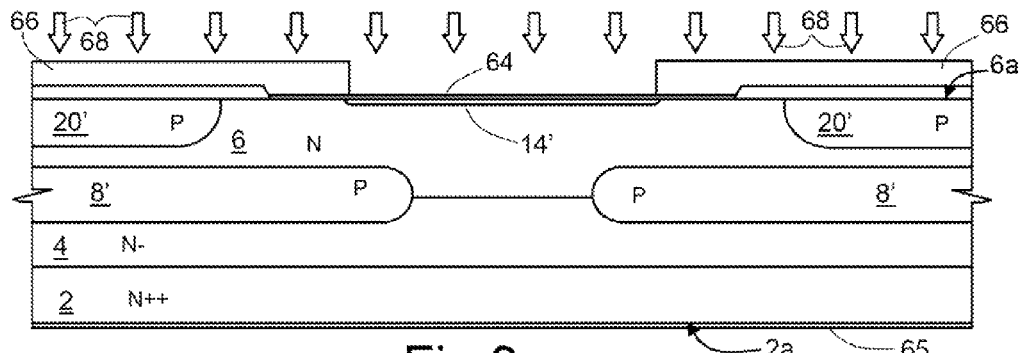
Figure 10:
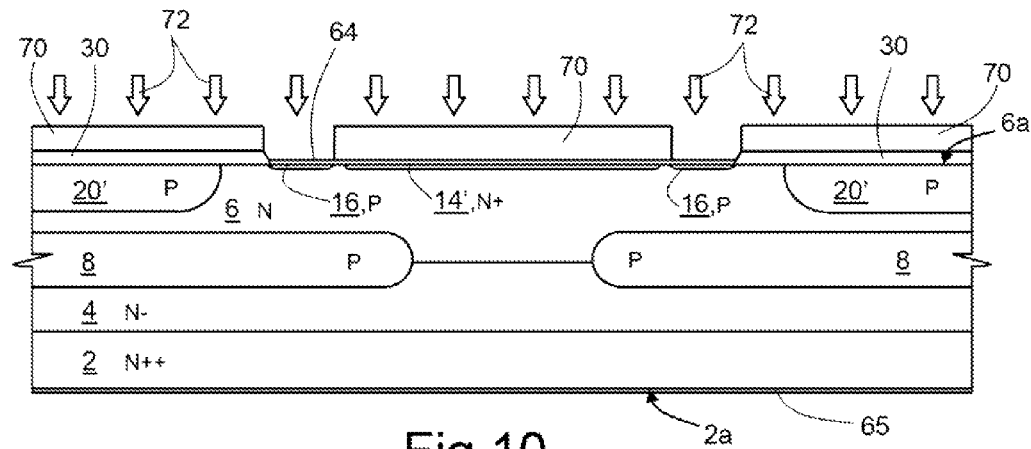
Figure 11:
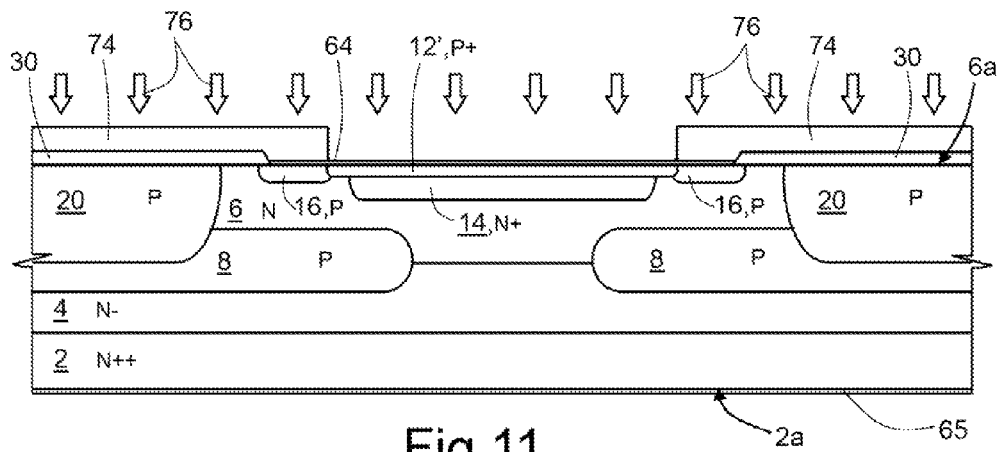

By way of example, FIG. 4 shows a further embodiment, in which the lateral insulation region 24 is set laterally staggered with respect to the sinker metallization region 22, and internally with respect to the sinker region 20, with consequent reduction of the overall dimensions of the photodiode 1. In detail, in this embodiment an internal sinker region 20a and an external sinker region 20b are present, extending between which is the lateral insulation region 24. Regions, metallizations, and layers already described and shown in FIG. 1 are designated by the same numbers used previously.

With reference to the embodiments shown in FIGS. 1 and 4, it should be noted how, in the case where a single photodiode 1 is present, the presence of the lateral insulation region 24 may be optional.

The photodiodes 1 described may be obtained using an embodiment of a manufacturing method described in what follows and represented in FIGS. 5-14, in which reference is made, by way of example, to the embodiment shown in FIG. 4. The embodiment described may in any case be used also for manufacturing the embodiments shown in FIG. 1, and for manufacturing other embodiments.

Initially, the first epitaxial layer 4, of an N− type (doped with phosphorus) and with a level of doping, for example, of approximately $5.5 \cdot 10^{13}$ cm$^{-3}$ (equivalent resistivity approximately equal to 80 Ω·cm), is grown on the substrate 2, of an N++ type (doped with phosphorus) and with level of doping, for example, of approximately $10^{19}$ cm$^{-3}$.

Next, a process of thermal oxidation, followed by a new process of removal by means of photolithography and chemical etching, enables provision, in a known way and by means of use of a layer of pre-implantation oxide (not shown), of the so-called alignment marks, not shown. The chemical etching is carried out, for example, in wet conditions, in so far as it prevents possible damage to the crystal lattice of the first epitaxial layer 4 and makes it possible to reduce the introduction of undesirable contaminating particles in the first epitaxial layer 4.

Next (FIG. 5), grown on the first epitaxial layer 4 is a first protective oxide layer 50, for example, a thermal-oxide layer, in order to prevent, during the subsequent processes of implantation doping, metal impurities from contaminating the first epitaxial layer 4. During formation of the first protective oxide layer 50, underneath the bottom surface 2a a first bottom dielectric layer 51 is formed.

Next, in order to reduce the contamination of sites external to the region where it is intended to perform the implantation of the enriched region 14, a first resist mask 52 is used. Hence, made in the first epitaxial layer 4 is an implantation with low dosage ($1 \cdot 10^{12}$-$3 \cdot 10^{13}$ cm$^{-2}$) and at a high energy (100 keV-1 MeV) of dopant species of a P type (for example, boron atoms), represented by the arrows 54, so as to localize the dopant species in a first thin layer 8' set underneath the protective layer 50 and designed to form the buried region 8 once purposely provided thermal treatments, as explained hereinafter, have terminated.

Next (FIG. 6), the first resist mask 52 is removed; the first protective oxide layer 50 and the first bottom dielectric layer 51 are moreover removed, for example by means of wet etching. In addition, grown on the first epitaxial layer 4 is the second epitaxial layer 6, of an N type (doped with phosphorus) and with a level of doping, for example, of approximately $5.5 \cdot 10^{15}$ cm$^{-3}$ (equivalent resistivity approximately equal to 1 Ω·cm). On the second epitaxial layer 6 a second protective oxide layer 56 is then grown; during this step, underneath the bottom surface 2a, a second bottom dielectric layer 57 is created. Next, a second resist mask 58 is used, and made in the second epitaxial layer 6 is an implantation with high dosage (approximately $3 \cdot 10^{15}$-$5 \cdot 10^{15}$ cm$^{-2}$) and at a high energy (approximately 100-200 keV) of dopant species of a P type (for example, boron atoms), represented by the arrows 60 so as to localize the dopant species in a second thin layer 20' set underneath the second protective oxide layer 56 and designed to form the sinker region 20 once purposely provided thermal treatments have terminated.

Next (FIG. 7), the second resist mask 58 is removed, as likewise the second protective oxide layer 56 and the second bottom dielectric layer 57; in particular, the second protective oxide layer 56 and the second bottom dielectric layer 57 are removed by means of wet etching. A first thermal annealing is then carried out in order to grow the first dielectric layer 30, formed by thermal oxide. The first thermal annealing is carried out at temperatures higher than approximately 1000° C., and for a duration of approximately a few hours so as to reduce the sites of the first epitaxial layer 4 and of the second epitaxial layer 6 damaged following previous ion-implantation processes, and to activate the dopant species. In addition, the first thermal annealing entails an increase in the thicknesses of the first thin layer 8' and of the second thin layer 20'. During the first thermal annealing, a third bottom dielectric layer 61 of thermal oxide grows underneath the bottom surface 2a of the substrate 2.

Next (FIG. 8), a photolithographic process is carried out so as to define a first window 62 in the first dielectric layer 30, obtained by means of wet etching so as to prevent damage to the photodiode 1 in a region corresponding to the first window 62 itself. During wet etching the third dielectric layer 61 is moreover removed.

Next, grown on the second epitaxial layer 6, in a position corresponding to the first window 62, is a third protective oxide layer 64; simultaneously to the third protective oxide layer 64, underneath the bottom surface 2a a fourth bottom dielectric layer 65 is formed.

Next (FIG. 9), a third resist mask 66 is provided, and made in the second epitaxial layer 6 is an implantation with low dosage (approximately $5 \cdot 10^{12}$-$6 \cdot 10^{12}$ cm$^{-2}$) and at low energy (approximately 20 keV-40 keV) of dopant species of an N type (for example, phosphorus atoms), represented by the arrows 68, so as to localize the dopant species in a third thin layer 14' set underneath the third protective oxide layer 64 and designed to form the enriched region 14 once purposely provided thermal treatments have terminated.

Next (FIG. 10), the third resist mask 66 is removed, and a fourth resist mask 70 is provided, with which, in the second epitaxial layer 6, an implantation is made with low dosage (approximately $5 \cdot 10^{12}$-$6 \cdot 10^{12}$ cm$^{-2}$) and at low energy (approximately 20 keV-40 keV) of dopant species of a P type (for example, boron atoms), represented by the arrows 72, so as to localize the dopant species in a fourth thin layer 16' extending underneath the third protective oxide layer 64, at a distance from the third thin layer 14', and designed to form the guard ring 16.

Next (FIG. 11), the fourth resist mask 70 is removed, and a second thermal annealing is carried out in order to reduce the sites of the first epitaxial layer 4 and of the second epitaxial layer 6 that have undergone damage following upon previous ion-implantation processes and activate the dopant species. The second thermal annealing is carried out at temperatures higher than approximately 1000° C. and for a duration of a few hours. In addition, formation is completed of the buried region 8, of the sinker region 20, of the enriched region 14, and of the guard ring 16, starting, respectively, from the first, second, third, and fourth thin layers 8', 20', 14' and 16'. Next, a fifth resist mask 74 is provided, with which an implantation is made with high dosage (approximately $1 \cdot 10^{14}$-$2 \cdot 10^{14}$ cm$^{-2}$) and at low energy (approximately 5 keV-10 keV) of dopant species of a P type (for example boron atoms) in the second epitaxial layer 6, represented by the arrows 76 so as to localize the dopant species in a fifth thin layer 12'. The fifth thin layer 12' extends underneath the third protective oxide layer 64 and is designed to form the anode region 12.

Figure 12:
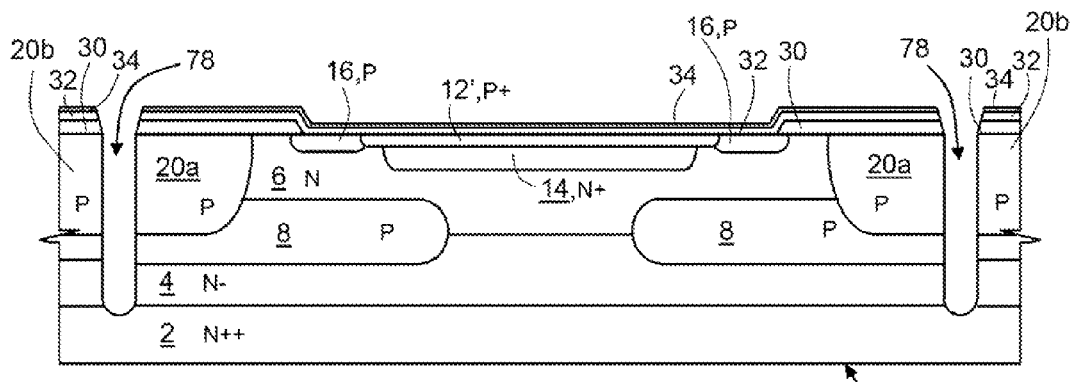

Next (FIG. 12), the third protective oxide layer 64 and the fourth bottom dielectric layer 65 are removed by means of wet etching. In addition, deposited, for example by means of the chemical-vapor-deposition (CVD) technique are the second dielectric layer 32, made, for example, of TEOS oxide, and the coating layer 34, made, for example, of nitride, so as to provide the anti-reflection coating 36. In order to provide the lateral insulation region 24, a trench 78 is subsequently made of a shape that is, for example, circular, quadrangular or, in general, polygonal, and of a width, for example, of approximately 1 μm. In particular, the trench 78 is provided by means of a process of dry-etching photolithography. As is shown in FIG. 12, in the case where it is intended to reproduce the embodiment shown in FIG. 4, the trench 78 is provided inside the sinker region 20; alternatively, in the case where it is intended to reproduce the embodiment shown in FIG. 1, the trench 78 is provided outside the sinker region 20 (case not shown).

Next (FIG. 13), grown inside the trench 78 is the thin coating layer 27a, made of thermal oxide and having a thickness comprised in the range of approximately 15-25 nm; during this step, underneath the bottom surface 2a a fifth bottom dielectric layer 79 is formed. There is then deposited, for example by means of the CVD technique, a dielectric layer, which comes to form both the thick coating layer 27b and the third dielectric layer 38. This layer can be made, for example, of TEOS oxide and have a thickness of the order of a few hundreds of nanometers (for example, approximately 100-200 nm).

It should be noted that the thin coating layer 27a coats only the internal edges and the bottom of the trench 78 in so far as the thermal oxide cannot grow on the coating layer 34, which is made of nitride. Consequently, on the top surface 6a, in addition to the already mentioned first and second dielectric layers 30 and 32, and the coating layer 34, only the third dielectric layer 38 is added.

The step of thermal growth of the thin coating layer 27a requires an amount of heat, which is usefully employed for activating the dopant species implanted in the fifth thin layer 12' and obtaining the anode region 12, of a P+ type and with peak density of dopant, for example, of approximately $10^{19}$ cm$^{-3}$.

At the end of the operations described previously, the buried region 8 has a peak level of dopant comprised, for example, approximately between $1 \cdot 10^{15}$ cm$^{-3}$ and $1 \cdot 10^{16}$ cm$^{-3}$; the sinker region 20 has a peak level of dopant comprised, for example, approximately between $1 \cdot 10^{19}$ cm$^{-3}$ and $2 \cdot 10^{19}$ cm$^{-3}$; the enriched region 14 has a peak level of dopant comprised, for example, approximately between $4 \cdot 10^{16}$ cm$^{-3}$ and $5 \cdot 10^{16}$ cm$^{-3}$; and the guard ring 16 has a peak level of dopant, for example, of approximately $10^{16}$ cm$^{-3}$.

Figure 13:
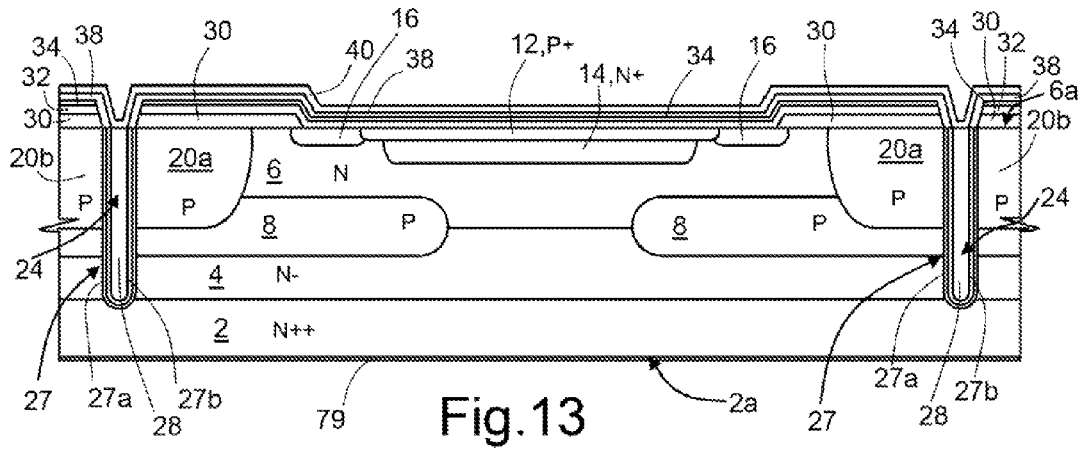
Figure 14:
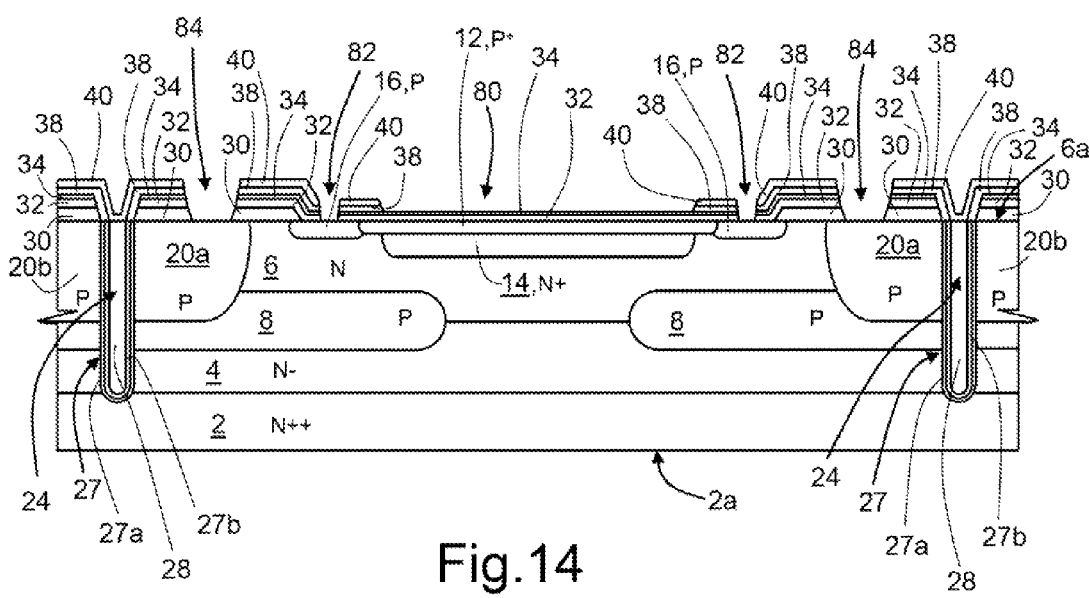

Next, as is shown once again in FIG. 13, the trench 78 is completely filled via deposition by means of CVD technique of metal, for example tungsten, to form the metal region 28. After deposition of metal, an etch is carried out, for example a dry etch, for removal of the metal portion deposited on the top surface 6a. Next, the fourth dielectric layer 40 is deposited, which is made, for example, of TEOS oxide, so as to insulate the metal region 28 electrically.

Next (FIG. 14), the fifth bottom dielectric layer 79 is removed by means of dry etching, and then a process of photolithography and wet etching is carried out in order to selectively remove portions of the third dielectric layer 38 and of the fourth dielectric layer 40 so as to form a second window 80, set above the enriched region 14 and the anode region 12, so as to leave exposed the region of the double anti-reflection coating 36, which, in use, enables passage of photons impinging on the photodiode 1 towards the anode region 12 and the enriched region 14.

Next, in view of the provision of the anode metallization 18 and sinker metallization 22, a further photolithography is carried out, followed by a dry etch and by a highly selective wet etch in order to obtain a third window 82 and a fourth window 84, which are set, respectively, on the guard ring 16 and the sinker region 20. In particular, the dry etch enables removal in sequence of portions of the fourth dielectric layer 40, of the third dielectric layer 38, of the coating layer 34, and of the second dielectric layer 32, these portions being set on top of the guard ring 16 and of the sinker region 20. The highly selective wet etch enables, instead, removal of portions of the first dielectric layer 30 in an area corresponding to the sinker region 20.

Next, a step of deposition by means of a technique of sputtering of metal material is carried out, followed by a photolithographic process so as to provide the anode metallization 18 and sinker metallization 22. Then deposited on the bottom surface 2a of the substrate 2, by means of the sputtering technique, is further metal material in order to provide the cathode metallization 42, thus obtaining the structure of FIG. 4.

Finally, a process of sintering at low temperature and in a hydrogen-based environment is carried out in order to passivate possible dangling bonds at the interface between oxide regions and silicon regions so as to reduce the Schockley-Read-Hall recombination rate.

Figure 15:
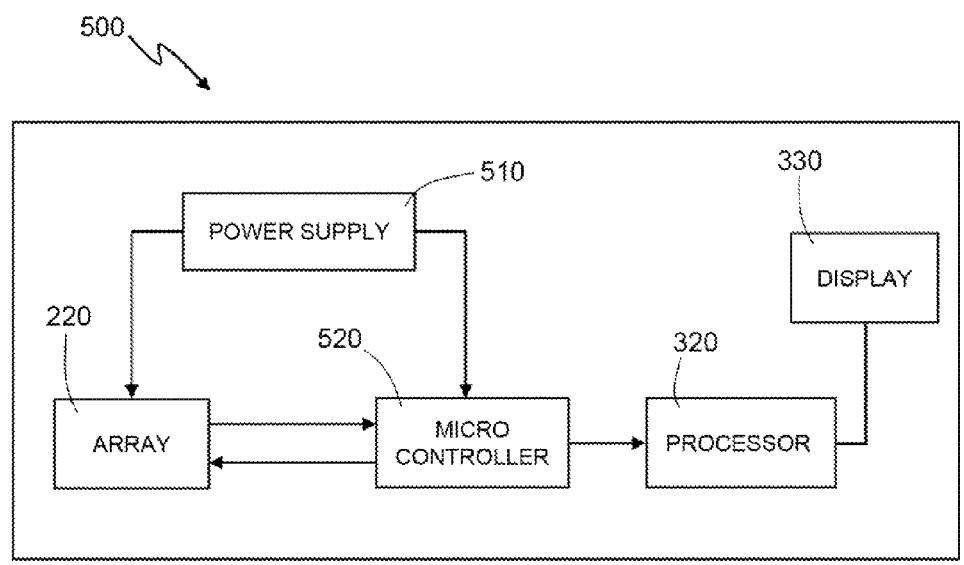
FIG. 15 shows an embodiment of a system that may use a photodiode array.

The array 220 of photodiodes 1 may be used in an embodiment of a generic system 500 shown in FIG. 15, in which a power supply 510 supplies at least one array 220 of photodiodes 1 and at least one microcontroller 520 coupled to the array 220. The microcontroller 520 processes the output signal of the array 220 of photodiodes 1, and supplies a processed signal to a processor 320, which enables analysis of the processed signal and display of the information associated to the processed signal on a screen 330.

Advantages that one or more embodiments of the present Geiger-mode photodiode may make available emerge clearly from the foregoing discussion. In particular, an embodiment of the photodiode enables control of the resistance of the quenching resistor 44 according to the applications, enabling, for example, an increase in the overvoltage OV; in the limit, it is possible to deplete the internal region 9 completely, thus reducing the effective area $A_e$ to zero and obtaining a virtually infinite resistance. In addition, the present photodiode enables control of the resistance of the quenching resistor 44 without the need to resort to lateral-insulation regions with high aspect ratios. Furthermore, owing to the presence of the second epitaxial layer 6 and to the level of doping of the second epitaxial layer 6, the resistance of the quenching resistor 44 may be controlled without modifying the bias of the first PN junction formed by the anode region 12 and the enriched region 14. In other words, the first PN junction may be electrically decoupled from the buried region 8.

Finally, it is evident that modifications and variations may be made to the embodiments of the photodiode and of the process described herein, without thereby departing from the scope of the present disclosure.

For example, the body 10, the anode region 12, the guard ring 16, and the buried region 8 may be of opposite type; in this case, the junction biasing voltage $V_j$ would be positive. In addition, the positions of the cathode metallization 42 and of the anode region 12 may be reversed.

Moreover possible are embodiments without the second epitaxial layer 6 and/or the guard ring 16. In addition, embodiments are possible without the enriched region 14 and/or the lateral insulation region 24.

As regards the channel stopper 27, it may be formed by a single layer of insulating material.

As regards, instead, the manufacturing method, the lateral insulation region 24 may be obtained at a different stage of the manufacturing method described. Furthermore, the sinker region 20 may be formed after the guard ring 16 and the enriched region 14, but before the anode region 12.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An electronic device, comprising:
    a first semiconductor region of a first conductivity type;
    a second semiconductor region of a second conductivity type disposed in the first semiconductor region, dividing the first semiconductor region into at least first and second portions, and defining a pathway between the first and second portions, the pathway comprising a first area bounded by the second semiconductor region;
    a third semiconductor region of the second conductivity type disposed in one of the first and second portions of the first semiconductor region and spaced from the pathway; and
    a fourth semiconductor region of the second conductivity type disposed over the first semiconductor region and having a second area that is larger than the first area.

2. The electronic device of claim 1 wherein:
    the first conductivity type is N type; and
    the second conductivity type is P type.

3. The electronic device of claim 1 wherein:
    the first conductivity type is P type; and
    the second conductivity type is N type.

4. The electronic device of claim 1 wherein the second semiconductor region is substantially annular and the pathway extends through a center of the second semiconductor region.

5. The electronic device of claim 1 wherein the first portion of the first semiconductor region comprises:
    a first subportion adjacent to the third semiconductor region; and
    a second subportion adjacent to the second semiconductor region and forming at least a portion of the pathway.

6. The electronic device of claim 1 wherein the first portion of the first semiconductor region comprises:
    a first subportion having a first dopant concentration and being adjacent to the third semiconductor region; and
    a second subportion having a second dopant concentration that is less than the first dopant concentration, being adjacent to the second semiconductor region, and forming at least a portion of the pathway.

7. The electronic device of claim 1 wherein the second portion of the first semiconductor region comprises:
    a first subportion adjacent to the second semiconductor region and forming at least a portion of the pathway; and
    a second subportion adjacent to the first subportion.

8. The electronic device of claim 1 wherein the second portion of the first semiconductor region comprises:
    a first subportion having a first dopant concentration, being adjacent to the second semiconductor region, and forming at least a portion of the pathway; and
    a second subportion having a second dopant concentration greater than the first dopant concentration and being adjacent to the first subportion.

9. The electronic device of claim 1, wherein the first semiconductor region further comprises:
    a surface; and
    a contact region having the second conductivity type and being disposed between the surface and the second semiconductor region.

10. The electronic device of claim 1, further comprising:
    wherein the first portion of the first semiconductor region comprises a surface;
    wherein the third semiconductor region is disposed in the first portion of the first semiconductor region adjacent to the surface; and
    a contact region having the second conductivity type and being disposed adjacent to the surface and the third semiconductor region.

11. The electronic device of claim 1, further comprising:
    wherein the second semiconductor region comprises a surface; and
    a contact region disposed over the surface.

12. The electronic device of claim 1, further comprising an isolation region disposed in the first semiconductor region and at least partially around the second semiconductor region.

13. The electronic device of claim 1, further comprising an opaque isolation region disposed in the first semiconductor region and at least partially around the second semiconductor region.

14. The electronic device of claim 1, further comprising a metal isolation region disposed in the first semiconductor region and at least partially around the second semiconductor region.

15. An integrated circuit, comprising:
    a first electronic device, including:
        a first semiconductor region of a first conductivity type;
        a second semiconductor region of a second conductivity type disposed in the first semiconductor region, dividing the first semiconductor region into at least first and second portions, and defining a pathway having a first area between the first and second portions;
        a third semiconductor region of the second conductivity type disposed in one of the first and second portions of the first semiconductor region and spaced from the pathway; and
        a fourth semiconductor region of the second conductivity type having an anode region flanked by an annular guard region having an annulus with an area that is larger than the area of the pathway.

16. The integrated circuit of claim 15 wherein the first electronic device comprises a Geiger mode avalanche photodiode.

17. The integrated circuit of claim 15, further comprising a second electronic device coupled to the first electronic device.

18. A pixel array, comprising:
multiple pixel sensors, each sensor including:
a first semiconductor region of a first conductivity type and having a thickness of approximately 15 micrometers;
a second semiconductor region of a second conductivity type disposed in the first semiconductor region, dividing the first semiconductor region into at least first and second portions, and defining a pathway between the first and second portions; and
a third semiconductor region of the second conductivity type disposed in one of the first and second portions of the first semiconductor region and spaced from the pathway.

19. The pixel array of claim 18 wherein at least one of the pixel sensors comprises a single photon avalanche diode.

20. The pixel array of claim 18, further comprising a controller coupled to the pixel sensors.

21. A system, comprising:
a pixel array, including:
multiple pixel sensors, each sensor including:
a first semiconductor region of a first conductivity type;
a second semiconductor region of a second conductivity type disposed in the first semiconductor region, dividing the first semiconductor region into at least first and second portions, and defining a pathway between the first and second portions, the pathway comprising a first area bounded by the second semiconductor region;
a third semiconductor region of the second conductivity type disposed in one of the first and second portions of the first semiconductor region and spaced from the pathway; and
a fourth semiconductor region of the second conductivity type disposed over the first semiconductor region and having a second area that is larger than the first area; and
an integrated circuit coupled to the pixel array.

22. The system of claim 21 wherein the pixel array and the integrated circuit are disposed on a same integrated circuit die.

23. The system of claim 21 wherein the pixel array and the integrated circuit are disposed on respective integrated circuit dies.

24. The system of claim 21 wherein the integrated circuit comprises a controller.

25. The system of claim 21, further comprising a display coupled to at least one of the pixel array and the integrated circuit.

* * * * *